United States Patent
Stewart et al.

(10) Patent No.: US 6,818,060 B2
(45) Date of Patent: Nov. 16, 2004

(54) ROBOT FOR MIXING CRYSTALLIZATION TRIAL MATRICES

(75) Inventors: Lansing J. Stewart, Bainbridge Island, WA (US); Alexandrina Muntianu, Bellevue, WA (US); Robin Clark, Bainbridge Island, WA (US)

(73) Assignee: Emerald BioStructures, Inc., Bainbridge Island, WA (US)

( * ) Notice: Subject to any disclaimer, the term of this patent is extended or adjusted under 35 U.S.C. 154(b) by 185 days.

(21) Appl. No.: 10/184,037

(22) Filed: Jun. 26, 2002

(65) Prior Publication Data

US 2003/0072683 A1 Apr. 17, 2003

Related U.S. Application Data

(63) Continuation-in-part of application No. 09/631,185, filed on Aug. 2, 2000.
(60) Provisional application No. 60/146,737, filed on Aug. 2, 1999, and provisional application No. 60/301,516, filed on Jun. 27, 2001.

(51) Int. Cl.[7] ................................. C30B 7/14
(52) U.S. Cl. ..................... 117/68; 117/69; 117/200; 117/201; 117/900; 422/245.1
(58) Field of Search ............... 117/68, 69, 200, 117/201, 900; 622/245.1

(56) References Cited

U.S. PATENT DOCUMENTS

| 4,755,363 A | 7/1988 | Fujita et al. |
| 5,078,975 A | 1/1992 | Rhodes et al. |

(List continued on next page.)

FOREIGN PATENT DOCUMENTS

| EP | 0 482 946 A1 | 4/1992 |
| EP | 0 553 539 A1 | 8/1993 |
| EP | 0 819 964 A1 | 1/1998 |
| EP | 1 085 292 A1 | 3/2001 |
| GB | 2 249 492 A | 5/1992 |
| JP | 07 055785 | 3/1995 |
| WO | WO 00/78445 A1 | 12/2000 |
| WO | WO 02/26342 A1 | 4/2002 |

OTHER PUBLICATIONS

CombiClover Crystallization Plate, [online], [retrieved on Apr. 18, 2004]. Retrieved from the Internet <URL://www.e-meraldbiostructures.com/combi_plates.htm>.

Cartesian NQ Series, [online], [retrieved on Apr. 18, 2004]. Retrieved from the Internet <URL://www.cartesiantech-.com/pixsysnq.html>.

RSP 9000–Robotic Sample Processor, [online], [retrieved on Apr. 18, 2002]. Retrieved from the Internet <URL://www.cavro.com/cav_main_rsp_9000.htm>.

Cavro XL 3000 Series Multi–Channel Pumps, [online], [retrieved on Apr. 14, 2002]. Retrieved from the Internet <URL://www.cavro.com/cav_main_xl_multi.htm>.

(List continued on next page.)

Primary Examiner—Robert Kunemeund
(74) Attorney, Agent, or Firm—Christensen O'Connor; Johnson Kindness PLLC

(57) ABSTRACT

A matrix mixing robot includes a plurality of precision pumps (such as precision syringe pumps), a distributor and a processor system. Each pump, under the control of the processor system, draws an associated stock solution from a stock solution source, and pumps the drawn stock solution out through an outlet. The distributor, also under the control of the processor system, directs a stock solution from a particular pump outlet to a selected solution receptacle. A multi-port distribution valve may be associated with each precision pump. Each valve, under control of the processor system, can connect its associated pump to one the pump's inlets or outlets.

43 Claims, 10 Drawing Sheets

U.S. PATENT DOCUMENTS

| | | | |
|---|---|---|---|
| 5,540,889 A | | 7/1996 | Gordon et al. |
| 5,671,086 A | | 9/1997 | Parvin et al. |
| 5,993,943 A | * | 11/1999 | Bodaghi et al. ............ 428/198 |
| 6,207,031 B1 | | 3/2001 | Adourian et al. |
| 6,383,412 B1 | * | 5/2002 | Hasegawa ............ 252/301.4 H |
| 6,402,837 B1 | | 6/2002 | Shtrahman et al. |
| 6,458,325 B1 | * | 10/2002 | Roscher et al. ............ 422/68.1 |

OTHER PUBLICATIONS

Cavro XL 3000 Modular Digital Pump, [online], [retrieved on Apr. 18, 2002]. Retrieved from the Internet <URL:// www.cavro.com/cav_main_xl_3000.htm>.

PCT/US02/15048, International Search Report (3 pp.).

Rubin, B., et al., "Minimal Intervention Robotic Protein Crystallization," *J. of Crystal Growth, 110*(1/2) : 156–163 (Mar. 1991).

Ward, K. B., et al., "Automatic Preparation of Protein Crystals Using Laboratory Robotics and Automated Visual Inspection," *J. of Crystal Growth, 90*: 325–339 (1988).

Jan. 2003 [retrieved on Feb. 6, 2003]. Retrieved from the Internet http://investor.brooks.com/releasedetail.cmf?releaseID=99420.

* cited by examiner

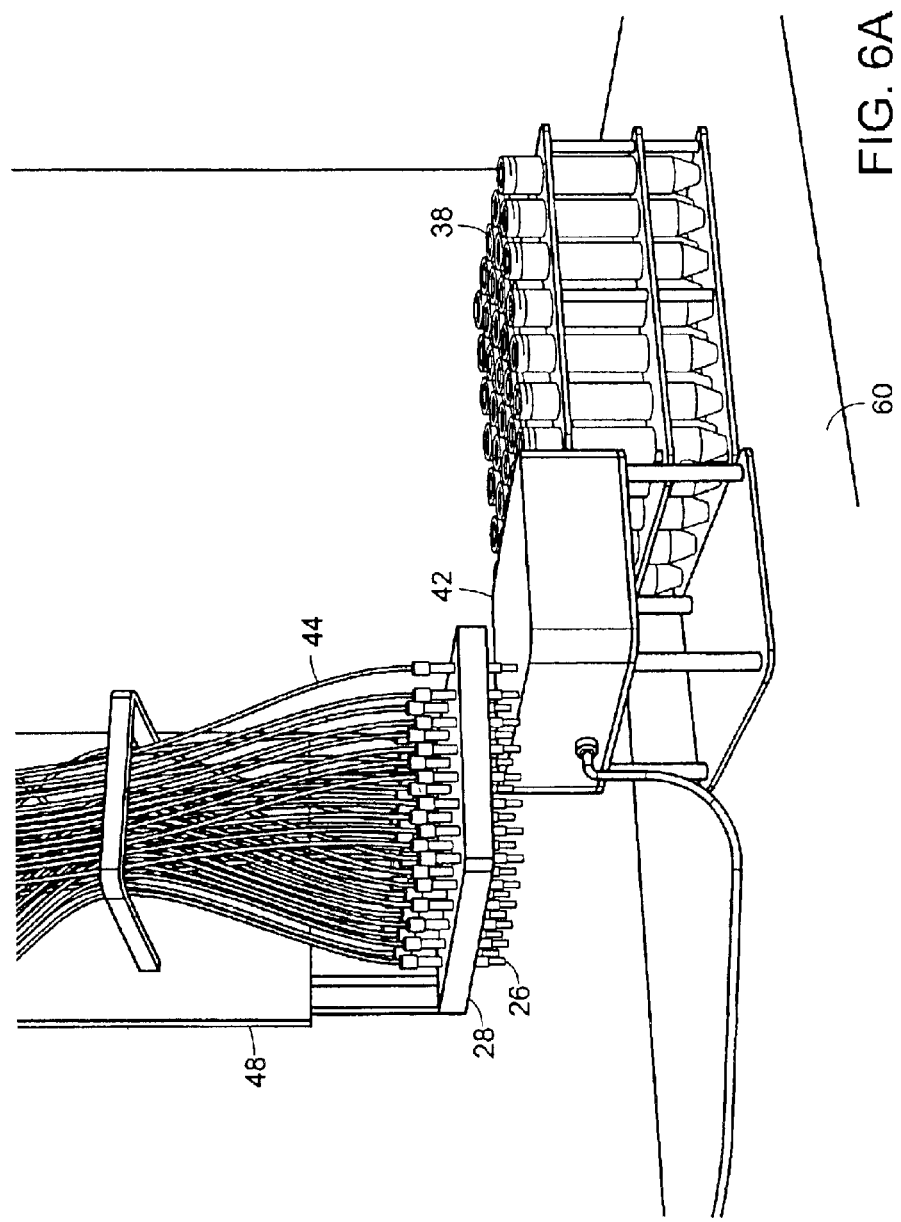

ROBOT FOR MIXING CRYSTALLIZATION TRIAL MATRICES

RELATED APPLICATIONS

This application claims the benefit of U.S. Provisional Application No. 60/301,516, filed on Jun. 27, 2001, and is also a continuation-in-part of U.S. patent application Ser. No. 09/631,185, filed on Aug. 2, 2000, which claims the benefit of U.S. Provisional Application No. 60/146,737, filed on Aug. 2, 1999. The entire teachings of the above applications are incorporated herein by reference, although for the convenience of the reader, some parts may be repeated herein.

BACKGROUND OF THE INVENTION

Macromolecular x-ray crystallography is an essential aspect of modern drug discovery and molecular biology. Using x-ray crystallographic techniques, the three-dimensional structures of biological macromolecules, such as proteins, nucleic acids, and their various complexes, can be determined at practically atomic level resolution. The enormous value of three-dimensional information has led to a growing demand for innovative products in the area of protein crystallization, which is currently the major rate limiting step in x-ray structure determination.

One of the first and most important steps of the x-ray crystal structure determination of a target macromolecule is to grow large, well diffracting crystals with the macromolecule. As techniques for collecting and analyzing x-ray diffraction data have become more rapid and automated, crystal growth has become a rate limiting step in the structure determination process.

Vapor diffusion is the most widely used technique for crystallization in modern macromolecular x-ray crystallography. In this technique, a small volume of the macromolecule sample is mixed with an approximately equal volume of a crystallization solution. The resulting drop of liquid (containing macromolecule and dilute crystallization solution) is sealed in a chamber with a much larger reservoir volume of the crystallization solution. The drop is kept separate from the reservoir, either by hanging from a glass cover slip or by sitting on a tiny pedestal. Over time, the crystallization drop and the reservoir solutions equilibrate via vapor diffusion of the volatile species. Supersaturating concentrations of the macromolecule are achieved, resulting in crystallization in the drop when the appropriate reservoir solution is used.

The process of growing biological macromolecule crystals remains, however, a highly empirical process. Macromolecular crystallization is a hyperdimensional phenomena, dependent on a host of experimental parameters including pH, temperature, and the concentration of salts, macromolecules, and the particular precipitating agent (of which there are hundreds). A sampling of this hyperspace, via thousands of crystallization trials, eventually leads to the precise conditions for crystal growth. Thus, the ability to rapidly and easily generate many crystallization trials is important in determining the right conditions for crystallization. Also, since so many multidimensional data points are generated in these crystallization trials, it is imperative that the experimenter be able to accurately record and analyze the data so that promising conditions are pursued, while no further time, resources, and effort are spent on negative conditions.

Recently, an international protein structure initiative has taken shape with the goal of determining the three dimensional structures of all representative protein folds. This massive undertaking in structural biology which may some day rival the human genome sequencing project in size and scope, is estimated to require a minimum of 100,000 x-ray structure determinations of newly discovered proteins for which no structural information is currently available or predicted. For perspective, the total number of reported novel crystal structures determined to date (spanning nearly 50 years of work) is only approximately 10,000.

Using existing methods for the crystallization of proteins (random screens of conditions), the protein structure initiative will require a minimum of approximately 100 million crystallization trials. In addition, the biological information gleaned from genomic research in the protein structure initiative are expected to create even more demand for structural information. Specifically, the biotechnology and pharmaceutical industries are estimated to require upwards of ten fold more protein crystallization experiments (one billion) as a result of research and structure based drug design and the use of crystallized therapeutic proteins. This would require that each of the approximately 500 macromolecular crystallography labs worldwide be responsible for setting up approximately 2000 crystallization trials every working day of the year for five years. Currently, there is no known device available for setting up analysis macromolecular crystallization data on this scale.

SUMMARY OF THE INVENTION

The preparation of crystal growth screening solutions is a tedious and time consuming endeavor. As such, high-throughput crystal growth demands that the construction of crystallization screening solutions be fully automated. To address this issue, the inventors have developed a method and system, an embodiment of which is called a "Matrix Maker", for creating new crystallization screening solutions in a crystallization plate (drawing from, for example, 96 different stock solutions). A variation of the invention ("Drop Maker") is capable of setting up crystallization drops in the plate once the screening solutions have been prepared in the plate.

Another embodiment of the invention is capable of running chromatographic protein purification experiments by aspirating crude cell extracts from a sample plate and pumping them over a plurality of chromatography devices such as chromatography cartridges or columns. The chromatography devices are then washed by pumping a plurality of different elution buffers over the chromatography devices and collecting the liquids that flow through the chromatography devices into recipient containers. a single valve port serving as both inlet port and outlet port, and the connected pin being both a dispensing pin and an aspiration pin.

According to an embodiment of the present invention, a system for mixing crystallization trial matrices includes a plurality of precision pumps (such as precision syringe pumps), a distributor and a processor system, which may contain one or more computer or digital processors. Each pump draws, under the control of the processor, an associated stock solution from a stock solution source, and pumps the drawn stock solution out through an outlet. The distributor, also under the control of the processor system, directs a stock solution from a particular pump outlet to a selected solution receptacle or holder.

A multi-port distribution valve may be associated with each precision pump. Each valve, under control of the processor system, can at any time connect its associated pump to one of the inlets or outlets.

In one embodiment, individual inlets of a particular pump may be connected to different stock solutions. Each outlet of a pump may be uniquely associated with an inlet, such that a particular stock solution always enters through one of said inlets and always exits through the associated outlet. Furthermore, each pump may have an inlet connected to a water/wash source, and an outlet for disposing of waste.

In one embodiment, the distributor comprises one or more outlet manifolds which hold an array of dispensing pins that are connected to the outlet ports, and positioning means for aligning a particular pin over the desired solution receptacle. The dispensing pins may be made of stainless steel or some other suitable material. The distributor may also have an array of pins that are connected to tubing that is connected to one of the pump inlets. The pins and their associated lines may be used to aspirate or dispense liquids from solution receptacle container plates located beneath the distributor.

The positioning means may include a gantry on which the outlet manifold is supported. The processor system may control the movement of the gantry in two or three dimensions. In one embodiment, multiple gantries may be used.

Solution receptacles may be test tubes, crystallization plate wells, or other suitable containers (for example, Society for Biomolecular Screening type plasticware devices) that may be, for example, arranged in an array.

In one embodiment, the processor controls the pumps, valves and gantry according to predefined recipes that describe which solutions are to be mixed, each destination solution receptacle, and solution volumes. These recipes may be viewed and edited by a user.

In another embodiment, the processor may control the pumps, valves and gantry according to predefined protocols for purifying proteins chromatographically or for setting up crystallization plates. The protocols may be viewed and edited by a user.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 6A is an illustration showing, in the embodiment of FIG. 3, the outlet manifold mounted to a gantry.

DETAILED DESCRIPTION OF THE PREFERRED EMBODIMENT

A description of preferred embodiments of the invention follows.

Figure 1:
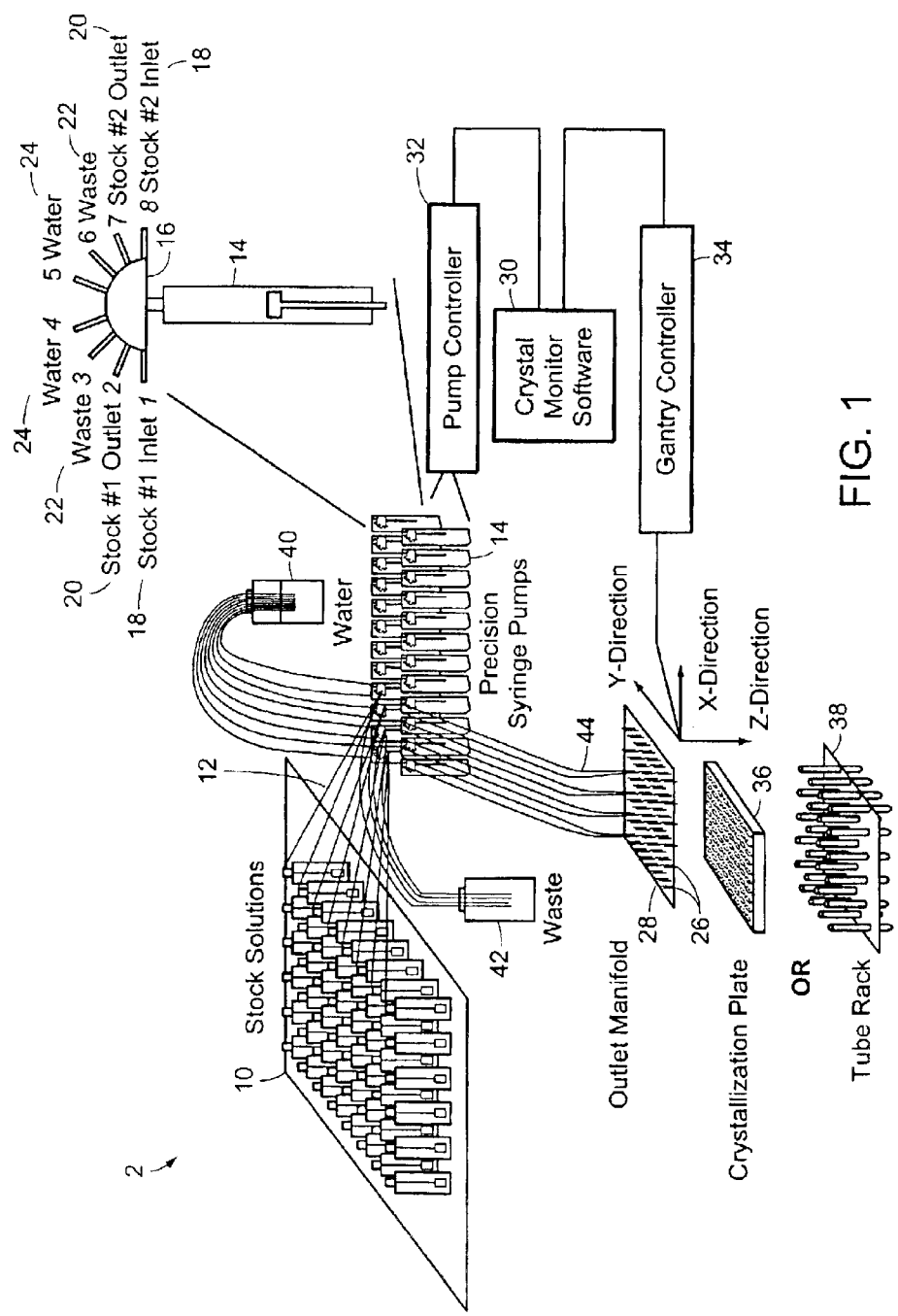
FIG. 1 is a schematic diagram illustrating the operation of an embodiment of the invention, called a "Matrix Maker Robot."

FIG. 1 is a schematic diagram illustrating the operation of an embodiment 2 of the invention, called a "Matrix Maker Robot." This design has many important features.

For example, an embodiment of the present invention uses positive pressure displacement of stock solutions through independently controlled precision syringe pumps, such that no disposable pipette tips are required. Viscous stock solutions can be delivered with high accuracy and speed through stainless steel outlet pins that do not come into contact with the recipient plasticware or reservoirs solutions as they are being created.

Proven "workhorse" precision syringe pumps, such as those manufactured by Tecan Systems (formerly Cavro Scientific Instruments, Inc.), can be used, minimizing subsequent maintenance.

Different sizes of syringes can be used to meet varying accuracy and scalability needs.

More stock solutions can be added to the system as needed or demanded.

Sterility of stock solutions can be maintained by eliminating open exposure to air.

Finally, the appropriate volumes of stock solutions can be delivered directly to a crystallization plate or into sample tubes through the use of a manifold which is attached to a robotic gantry that can move in the X, Y and Z directions (e.g., lateral width, lateral depth and vertical directions). The outlet lines "shoot" stock solutions into the recipient plate (i.e., the individual solution receptacles).

Despite extensive investigation, the inventors were unable to identify a commercial liquid handling device that met these specifications.

Referring now to FIG. 1, plural (e.g., forty-eight) bottles 10 holding various stock solutions are directly connected via Teflon™ tubing 12 (of the shortest reasonable length) to the inlet ports of, for example twenty-four, individual precision syringe pumps 14, such as Tecan Systems' Cavro XL-3001. Each pump 14 is equipped with an 8-port distribution valve 16. In the illustrated embodiment, each pump 14 is attached through its distribution valve 16 to inlet lines 18 for two (2) different stock solutions, at valve positions 1 and 8.

Each pump 14 has two outlet lines 20, at valve positions 2 and 7, one for each of the two stock solutions. These outlet lines 20 are attached via tubing 44 (with the shortest reasonable distance) to an array of stainless steel dispensing pins or nozzles 26 held by an outlet manifold 28, which itself may be constructed from metal or some other suitable material.

Each pump 14 also has two waste outlet lines 22, for example at valve positions 3 and 6, through which waste is dumped into a waste container 42. In addition, each pump 14 has two water inlet lines 24, for example at valve positions 4 and 5, connected to a water/wash supply 40.

The outlet manifold 28 is mounted to a robotic gantry system 48 (see, for example, FIG. 6A) that can move the outlet manifold 28 in the X, Y, and Z directions/dimensions. The twenty-four pumps 14 are controlled by a controller 32. The robotic gantry 48 is controlled by a gantry controller 34. The pump/valve controller 32 and the gantry controller 34 shown in FIG. 1 may comprise both software components and hardware components (collectively, generally referred to as a processor system).

In one embodiment, the stock solution bottles 10, inlet lines 12, valves 16, and syringe pumps 14 are comprised of chemically resistant materials such as Teflon™, polyetheretherketone (also known as PEEK™), glass, and stainless steel, such that the entire liquid path can withstand extreme pHs, high ionic strengths, and organic solvents. In this embodiment, the entire liquid path can be sterilized with chemical reagents such as ethanol, followed by extensive water washing and priming with filter sterilized stock solutions.

Solution receptacles, into which the various solutions are delivered, may be placed on a platform below the outlet manifold 28. For example, the solution receptacles may be wells arranged in an array on a crystallization plate 36, or tubes held in a tube rack 38. Multiple plates and/or tube racks may be positioned on the platform, and the software programmed accordingly to fill the containers of the various plates and tube racks.

In a preferred embodiment, the solution receptacles are stationary while the delivery system is positioned by the robotic gantry 48.

Software 30, such as Crystal Monitor™, available from Emerald BioStructures, Inc., of Bainbridge Island, Wash., provides for simple creation of a "recipe" for making a new set of screening solutions in the desired recipient crystallization plate 36 or rack 38 of tubes.

For example, the software 30 may have the ability to capture distance constraint information on plasticware and tube racks. The software can also calculate the volume of stock solutions needed to create a new crystallization screening matrix. It also has a knowledge base of the viscosity of each stock solution.

Database (DB) tables and graphical user interface (GUI) modules of software 30 may be used to perform the following: a) map stock solutions to physical positions on the invention; b) map stock solution inlet lines to valve positions on syringe pumps; c) map stock solution outlet lines to valve positions on syringe pumps; d) map stock solution outlet lines to outlet manifold pin positions on the gantry; and e) provide a knowledge base of titration curves for the final pHs achieved from mixing variable quantities of buffer stocks at 1 pH unit above and below the pKa of the buffer.

Figure 2:
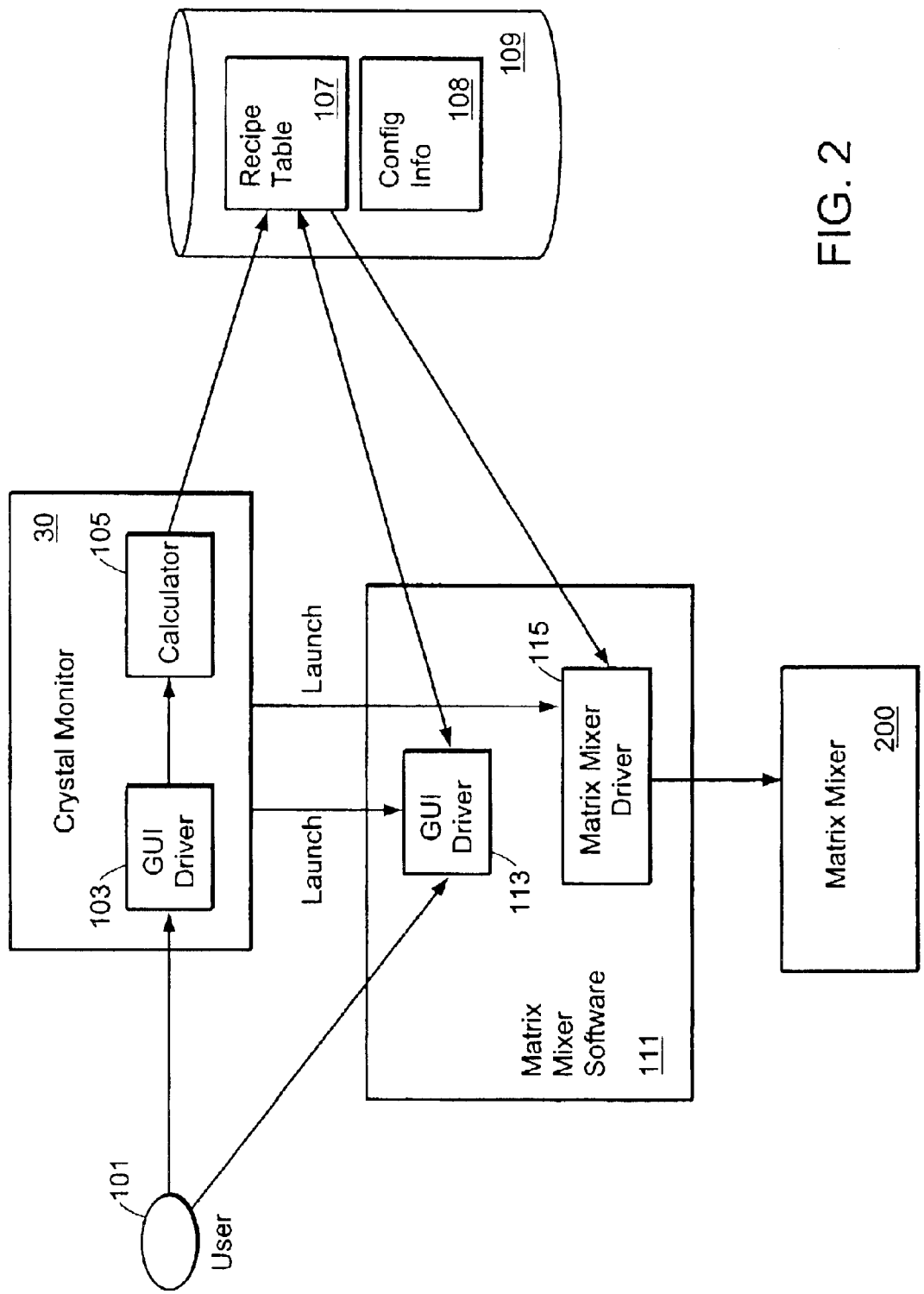
FIG. 2 is a schematic diagram illustrating the generation and use of matrix recipes.

FIG. 2 is a schematic diagram illustrating the generation and use of the recipes. A user 101 may communicate with software 30 such as Crystal Monitor through a graphical user interface (GUI) driver 103, to define the system configuration as well as crystallization trial matrix solution specifications. A calculator 105 portion of the software 30 generates the "recipes", which may be stored, for example, in a table 107 in a database 109. Note that the system configuration information may also be stored in a table 108 in the same or a different database. The GUI driver 103 and calculator 105 may be integral parts of, for example, the matrix manager software described in U.S. application Ser. No. 09/631,185.

Robot mixer control software 111 also contains a GUI driver 113, which may be launched by the Crystal Monitor program 30. The robot mixer control software 111 allows the user 101 to directly view and edit the contents of the recipe table 107.

Crystal Monitor 30 is able to launch the robot mixer driver 115 upon an appropriate user action. Based on the configurational information 108 and the recipes 107, the robot mixer driver 115 can generate a sequence of instructions or commands to control the matrix maker robot 200, by driving the syringe pumps 14, valves 16 (FIG. 1), and gantry 48 (see FIG. 3) in precise concert and sequence to deliver the appropriate stock solutions into the desired recipient containers.

The robot mixer driver 115 takes into account several considerations, including, but not limited to, the following:

(1) The final pH's for buffers are achieved by delivering the appropriate volumes of stock buffers which bracket the buffer pKa by +/−1 pH unit (with reference to experimentally determined titration curves);

(2) The delivery sequence for different chemical types should be optimized;

(3) Travel distances should be minimized;

(4) Scheduling of pump wash cycles should be efficient; and (5) "Chemical compatibility" features may be provided that warn the user that chemical precipitation would occur upon mixing certain chemicals (e.g., Ca2+ and phosphate are incompatible).

The table below illustrates a few exemplary rows (recipes) as might be defined in the recipe table 107. Although twelve columns are shown, it would be understood by one skilled in the art that other columns can be added for various purposes. However, only those columns needed to demonstrate the present invention are shown.

The "Dispensation No." is simply an identifier to identify a particular row in the table 107. Here, ten recipe rows are shown, having dispensation numbers from 58168 to 58177 respectively.

The matrix mixer driver 115 may be capable of controlling multiple mixer robots 200. Therefore, the "Robot ID" column serves to identify the particular robot 200 to which the row pertains. Here, all rows pertain to robot #2.

A matrix may be given a name, specified in the "Matrix Name" column.

A robot may be capable of processing multiple trays simultaneously. Each tray maybe identified by a unique identifier. Here, all of the rows pertain to tray #12 of robot #2.

"Reagent No." specifies which stock solution bottle (10 from FIG. 1) is to be pumped, and the "Row" and "Col" columns specify the position of the receiving container that is to receive the identified stock solution. The "Vol" column indicates the volume to be dispensed, here in microliters.

So, for example, the first five rows, identified as dispensation numbers 58168 through 58172, direct that various stock solutions (from bottles numbered 19, 45, 11, 13 and 1 respectively) be dispensed into the container positioned at row 1, column 1, for tray 12 at robot 2, resulting in a 2-milliliter solution. The next five rows, identified as dispensation numbers 58173 through 58177 specify the solution to be mixed in the receptacle/container at row 1, column 2 of the same tray.

The "Asp", "Disp", and "Drop" flags are simply flags used to indicate whether a respective particular operation has been done yet. For example, in the row for dispensation no. 58170, the Asp flag (=Yes) indicates that aspiration has been performed, that is, the reagent from bottle 11 has been drawn into the corresponding pump 14. The Disp flag (=No) indicates that the stock solution has not yet been dispensed from the pump 14.

After dispensation, a drop of the stock solution may be hanging from the end of the dispensing pin. To prevent this drop from falling into and contaminating the dispensed solutions when the gantry is moved, an additional "drop" operation may be performed to draw back the drop (say about 5 microliters) into the dispensing pin. The "Drop" flag indicates whether this operation has been performed.

Finally, the status flag is used to indicate current status to the Crystal Monitor software 30 (FIG. 1).

to utilize various racks containing different quantities of test tubes or different size test tubes, micro-plates, etc.

Figure 3:
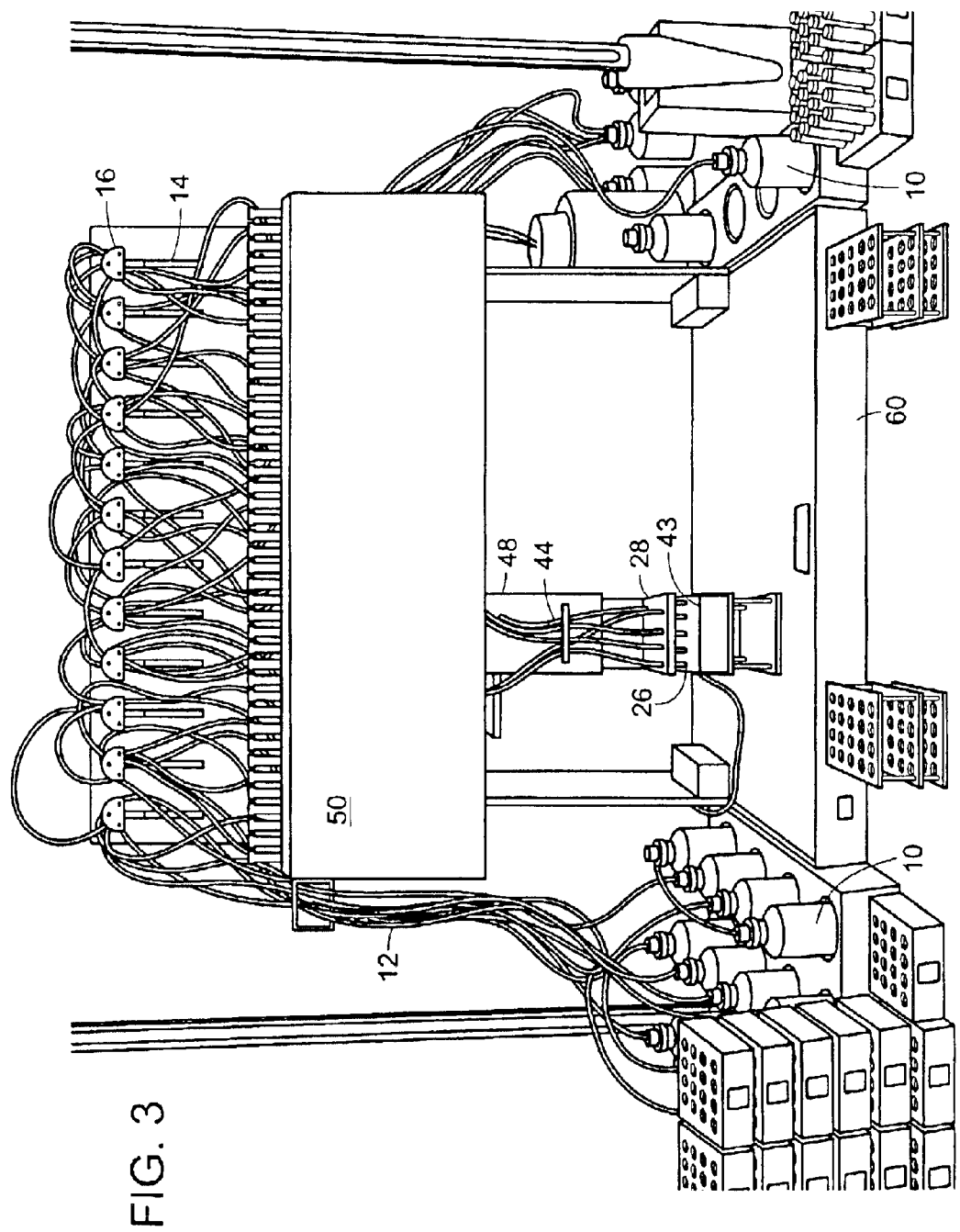
FIG. 3 is an illustration of an embodiment of the matrix maker of FIG. 2.
Figure 7:
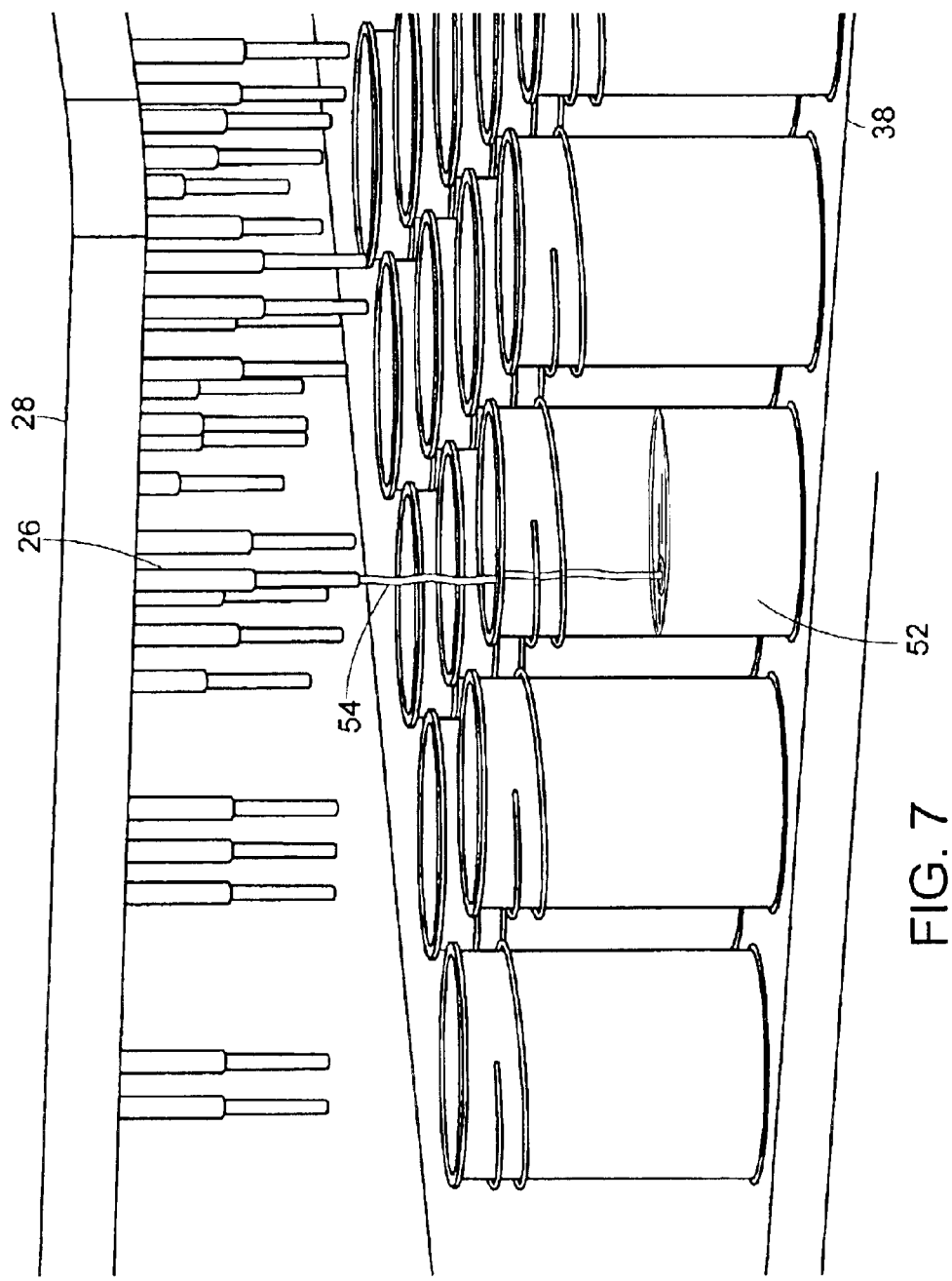
FIG. 7 is a closeup illustration of the embodiment of FIG. 3, showing the dispensing pins sticking through the outlet manifold.

FIG. 7 is a closeup illustration of the embodiment of FIG. 3, showing the dispensing pins 26 sticking through the outlet manifold 28. Here, one solution 54 is being delivered to a receiving test tube 52, located in the test tube rack 38. It should be understood that multiple solutions may be delivered or dispensed to multiple receiving containers simultaneously.

| Dispensation No | Robot ID | Matrix Name | Tray TD | Reagent No | Row | Col | Vol | Asp Flag | Disp Flag | Drop Flag | Status Flag |
|---|---|---|---|---|---|---|---|---|---|---|---|
| 58168 | 2 | matrix001 | 12 | 19 | 1 | 1 | 200 | No | No | No | 1 |
| 58169 | 2 | matrix001 | 12 | 45 | 1 | 1 | 80 | No | No | No | 1 |
| 58170 | 2 | matrix001 | 12 | 11 | 1 | 1 | 367.5373 | Yes | No | No | 1 |
| 58171 | 2 | matrix001 | 12 | 13 | 1 | 1 | 32.46267 | Yes | Yes | No | 1 |
| 58172 | 2 | matrix001 | 12 | 1 | 1 | 1 | 1320 | Yes | Yes | Yes | 1 |
| 58173 | 2 | matrix001 | 12 | 19 | 1 | 2 | 200 | Yes | Yes | Yes | 1 |
| 58174 | 2 | matrix001 | 12 | 45 | 1 | 2 | 80 | Yes | Yes | Yes | 1 |
| 58175 | 2 | matrix001 | 12 | 11 | 1 | 2 | 312.7144 | Yes | Yes | Yes | 1 |
| 58176 | 2 | matrix001 | 12 | 13 | 1 | 2 | 87.28554 | Yes | Yes | Yes | 1 |
| 58177 | 2 | matrix001 | 12 | 1 | 1 | 2 | 1320 | Yes | Yes | Yes | 1 |

The matrix mixer driver 115 can accommodate various syringe sizes (e.g., 0.25 to 25 mL) and syringe speeds, different volume settings, etc.

FIG. 3 is an illustration of an embodiment of the matrix mixer 200 of FIG. 2. Stock solution bottles 10 are seated along either side of the platform 60. The stock solutions 10 are connected to the syringe pumps 14 via inlet tubing 12. The pumps 14 and their 8-position valves 16 sit atop a housing 50, which contains the gantry drive system for positioning the robotic gantry 48.

The outlet manifold 28 sits on the robotic gantry 48. Outlet tubing 44 connects the pumps 14 with the dispensing pins 26 which deliver the various solutions.

Here, the outlet manifold 28 has been positioned over a wash/waste receptacle 43 which sits on the platform or deck 60. The wash/waste receptacle 43 shown is of sufficient size (with respect to area) such that as many as all of the syringes and outlet tubes 44 may be washed simultaneously.

Figure 4:
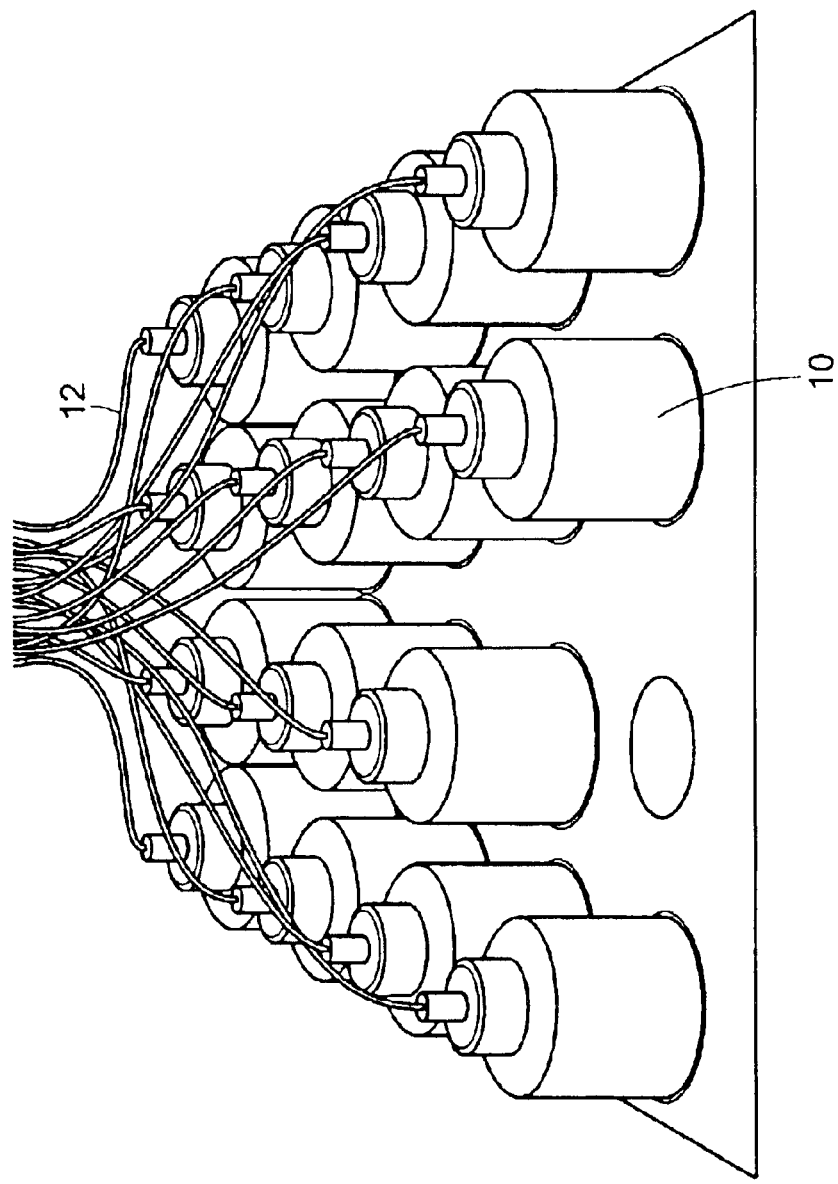
FIG. 4 is an illustration showing an array of stock solution containers and the tubing through which the solution passes, as employed in the embodiment of FIG. 3.

FIG. 4 is an illustration showing an array of stock solution containers 10 and the Teflon tubing 12 through which the solution passes, as employed in the embodiment of FIG. 3.

Figure 5:
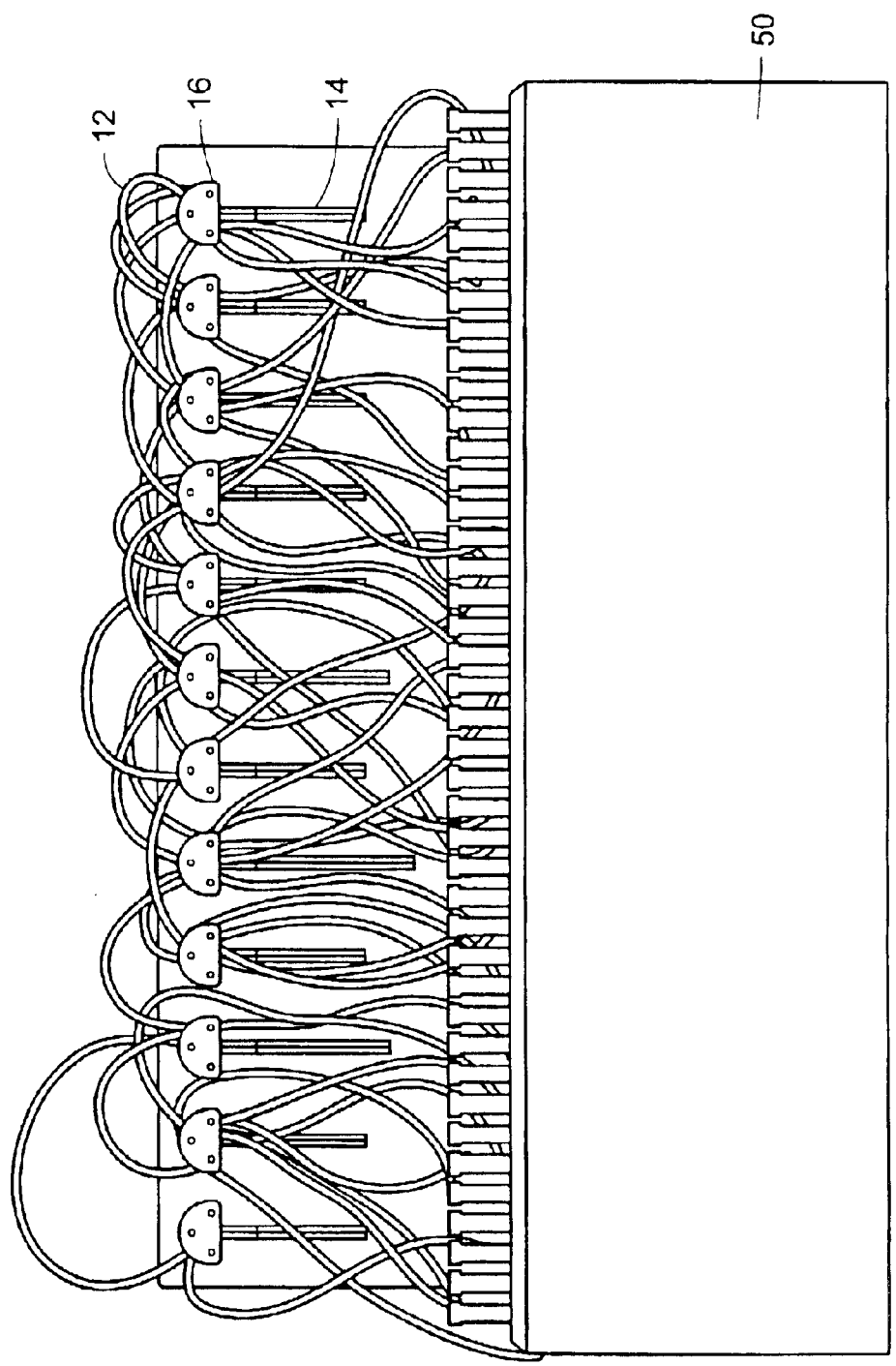
FIG. 5 is illustration showing the pumps in the embodiment of FIG. 3.

FIG. 5 is an illustration showing the pumps 14 in the embodiment of FIG. 3. A first row of pumps 14 is located on top of the housing 50. A second row of pumps 14 is located behind the first row and is not visible in the FIG. 5 view. As can be seen from the figure, each pump 14 is attached to an associated 8-position valve 16 previously described in detail.

FIG. 6A is an illustration showing, in the embodiment of FIG. 3, the outlet manifold 28 mounted to the gantry 48. Tubing 44 from the pump valve outlets 20 (FIG. 1) is brought to the outlet manifold 28, and is connected to an array of dispensing pins 26. A wash/waste receptacle 42 is located on a stable platform next to a tube rack 38.

Figure 6B:
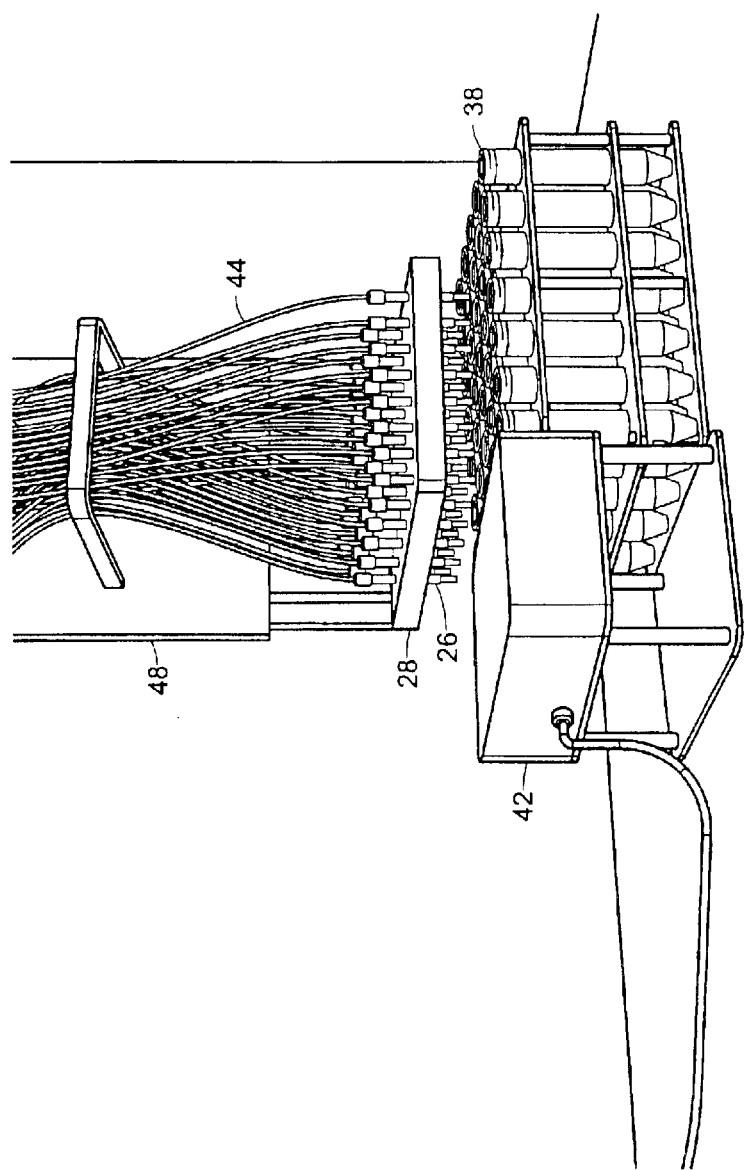
FIG. 6B is an illustration, similar to FIG. 6A, showing the gantry in a different position.

FIG. 6B is an illustration similar to FIG. 6A showing the gantry 48 in a different position with respect to tube rack 38 and wash/waste receptacle 42.

The tube rack 38 may be positioned to the platform/deck 60 via mounting pins (not shown) that allow the tube rack to be accurately positioned yet easily removed as an entire unit. This worktable mounting pin system provides the flexibility In an alternate embodiment, several syringe pistons may be attached to a common drive, as for example, on the Cavro XL-3000-8. Thus, when one syringe piston is moving to deliver liquid, the other seven syringe pistons also move with the exact same stroke. However, the switch valves at the top end of each syringe are independently operated. Hence, when the XL-3000-8 performs a single liquid delivery cycle, the switch valve for the desired stock solution is the only one switched to the output position. The other stock solutions are pumped back into the stock bottles.

In this embodiment, the stock solutions can be arranged such that they are attached to the 8-position syringe drivers in an order that provides minimal chance that a given syringe pump would have to operate through more than one cycle during the construction of a single crystallization solution. For example, stock solutions which have similar chemicals may be attached to the same 8-port precision syringe pump. Then, following recipes of table 107, the matrix mixer driver 115 controls mixer robots 200 to pump/dispense through a subject syringe pump 14 once per cycle accordingly.

Figure 8:
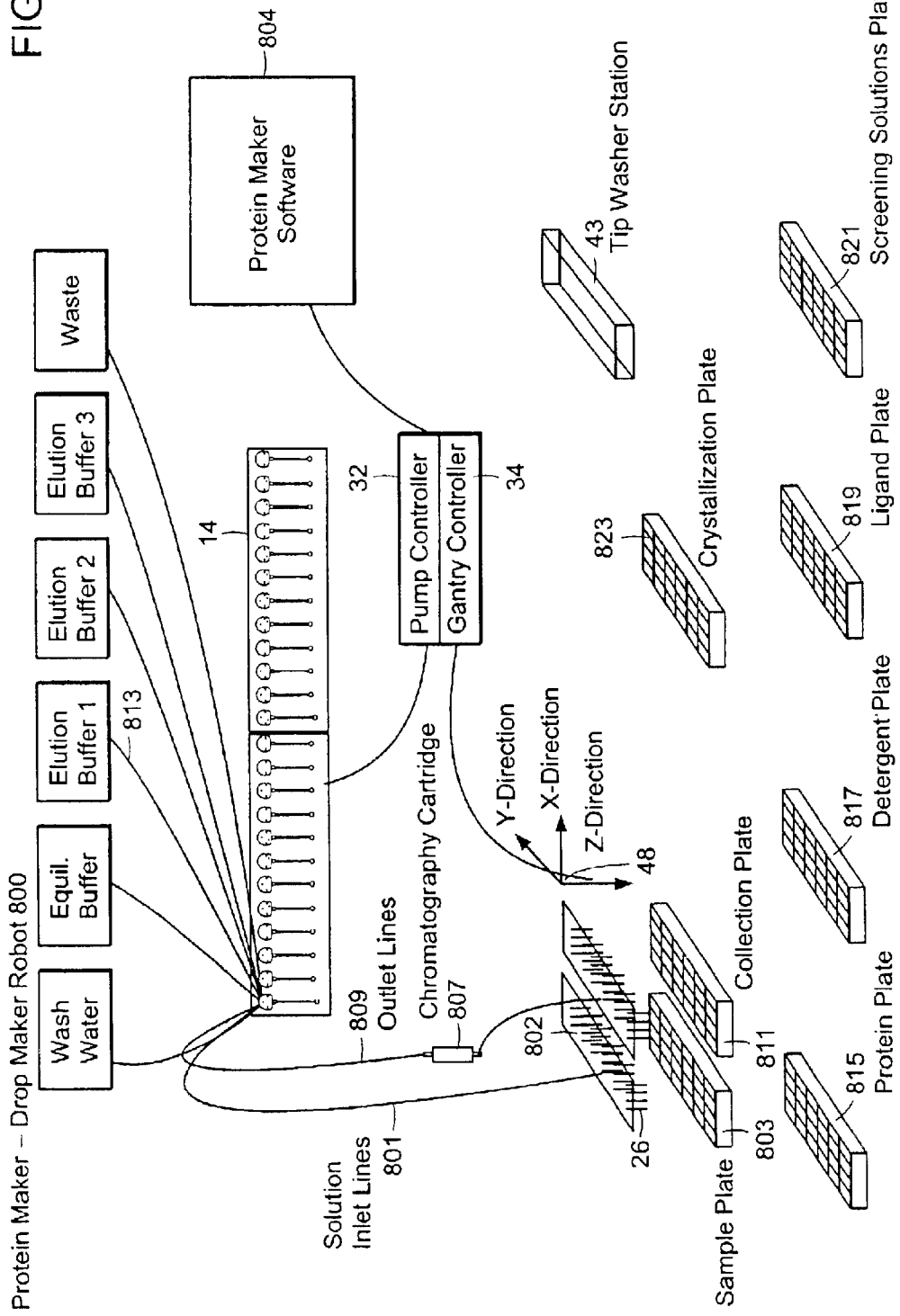
FIG. 8 is a schematic diagram illustrating the operation of an embodiment of the invention, called the "Protein Maker-Drop Maker Robot."

FIG. 8 is a schematic diagram illustrating the operation of another embodiment 800 of the invention, called a "Protein Maker-Drop Maker Robot." Solution inlet lines 801 are attached to an array of stainless steel pins or nozzles 26 held by a manifold 802. The manifold 802 is mounted to a robotic gantry system 48 (see, for example, FIG. 6A), which is controlled by software 804 via a gantry controller 34. The gantry controller 34 can control the movement of the manifold 802 in these orthogonal directions or dimensions. In this way, the pins 26 can be moved into sample plates 803 that contain desired solutions, which may be, for example, crude cell extracts containing protein, solutions containing purified protein, or chemical stock solutions. The pins, tubing and pumps involved are normally washed between aspirating different solutions to prevent contamination.

Alternatively, some pins could be offset from the rest and used individually without interference by the other pins.

Specified volumes of the solutions can be drawn into the inlet lines 801, by the appropriate specified valve 16 (see, for example, FIG. 1) and pump 14 movements under the control of software 804 via the pump controller 32. The solutions can be drawn into the syringe pumps 14, and then pumped through chromatography cartridges 807, via outlet lines 809, after the valves 16 change position to connect the pump 16 contents to the outlet lines 809.

The chromatography cartridges 807 are attached to an array of stainless steel dispensing pins or nozzles 26 held by the manifold 802. The solutions that flow through the chromatography cartridges 807 can be collected in collection plates 811, by software 804 controlled gantry movements of the manifold 802. Using specified pump 14 and valve 16 movements, the chromatography cartridges 807 can be washed with a plurality of different solutions (for example, wash buffer, equilibration buffer, elution buffers), which are attached to designated inlet valve 16 positions via additional inlet lines 813. The solutions that flow through the chromatography cartridges 807 can be collected in collection plates 811, by software 804 controlled gantry movements of the manifold 802.

Solutions from collection plates 811, protein sample plates 815, plates 817 containing detergents, plates 819 containing a set of ligands, and/or plates 821 containing crystallization screening solutions prepared from stock solutions by, for example, the matrix maker 200, can be sequentially aspirated into solution inlet lines 801 and dispensed into crystallization plates 823 from the solution inlet lines 801 by the appropriate software 804 controlled pump 14, valve 16, and gantry 48 movements. The inlet lines 801 can be flushed with water between each aspiration and dispensing cycle. The water flush can be captured in the tip washer station 43 by the appropriate software 804 controlled pump 14, valve 16, and gantry 48 movements.

It should be apparent to one skilled in the art that the Matrix Maker Robot 200 and the Protein Maker-Drop Maker Robot 800 embodiments enable scientists to prepare new crystallization screening solutions from stock solutions, purify proteins from crude cell extracts, and set up crystallization plates by drawing from solutions in plates that were produced by the same embodiments.

Figure 9:
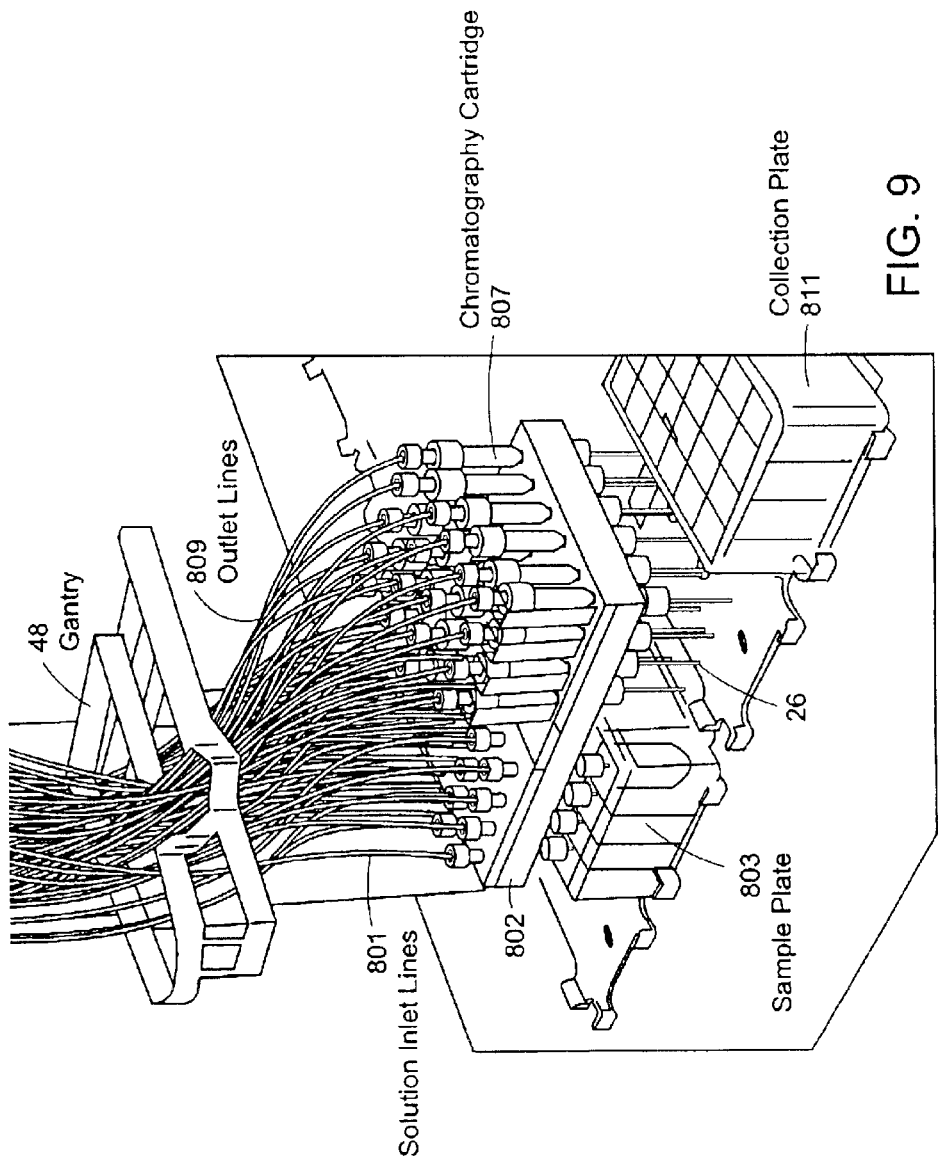
FIG. 9 is an illustration showing, in the embodiment of FIG. 8, the outlet manifold mounted to a gantry.

FIG. 9 is a closeup illustration of the embodiment of FIG. 8, showing the dispensing pins 26 sticking through the outlet manifold 802. Here, twenty four chromatography cartridges 807 are mounted onto the manifold 802 and attached to outlet lines 809. Also shown are twenty-four inlet lines 801 that are attached to the manifold 802. The gantry 48 is shown directing the movement of inlet pins 26 into a sample plate 803. A collection plate 811 is also shown.

While this invention has been particularly shown and described with references to preferred embodiments thereof, it will be understood by those skilled in the art that various changes in form and details may be made therein without departing from the scope of the invention encompassed by the appended claims.

What is claimed is:

1. A system for mixing and delivering solutions, comprising:
    a plurality of precision pumps, each pump drawing an associated stock solution from a solution source, and pumping the drawn solution out through an outlet;
    a distributor which directs a solution from a particular pump outlet to a selected one of a plurality of solution holders wherein said solution holders are not physically connected to the outlet of any one of the precision pumps; and
    a processor system which controls the precision pumps and the distributor.
2. The system of claim 1, further comprising: a multi-port distribution valve associated with each precision pump, each valve for connecting its associated pump to one of a plurality of associated inlets and outlets, the processor system controlling each valve.
3. The system of claim 2, individual inlets of a particular pump being connected to different solutions, and each outlet of said pump being uniquely associated with one of said inlets, such that a particular solution always enters through one of said inlets and always exits through the associated outlet.
4. The system of claim 2, wherein each pump has an inlet connected to a water/wash source.
5. The system of claim 2, wherein each pump has an outlet for disposing of waste.
6. The system of claim 2, wherein each pump comprises a mixing chamber that receives components of a mixture.
7. The system of claim 6, wherein contents of the mixing chamber are pumped to a dispensing pin.
8. The system of claim 1, wherein the distributor comprises:
    a manifold which holds an array of dispensing pins, the pins connected to the pump outlets; and
    positioning means for aligning a particular pin and a particular solution holder.
9. The system of claim 8, wherein the dispensing pins are made of stainless steel.
10. The system of claim 8, wherein the positioning means comprises:
    a gantry on which the manifold is supported, the processor system controlling movement of the gantry.
11. The system of claim 10, wherein the processor system controls movement of the gantry in three dimensions.
12. The system of claim 8, wherein the manifold further holds an array of aspiration pins connected to the pump inlets, the positioning means positioning particular aspiration pins over particular solution holders and inserting said aspiration pins into said solution holders for aspiration.
13. The system of claim 12, a single valve port serving as both inlet port and outlet port, and the connected pin being both a dispensing pin and an aspiration pin.
14. The system of claim 12, further comprising:
    a plurality of chromatography cartridges connected between pump outlets and dispensing pins, the processor system controlling:
        aspiration of a solution from a solution holder,
        pumping of the aspirated solution over the chromatography cartridges,
        washing of the cartridges with elution buffers, and
        collection, in recipient containers, of liquids flowing through the cartridges.
15. The system of claim 1, wherein a solution holder is one of a test tube, and a crystallization plate well.
16. The system of claim 1, wherein the precision pumps are precision syringe pumps.
17. The system of claim 1, wherein the processor system controls according to predefined recipes.
18. The system of claim 17, further comprising:
    means for allowing a user to view and edit a recipe.
19. The system of claim 1, the precision pumps being operated independently of each other.
20. The system of claim 1, wherein the processor system follows predetermined protocols to perform any of:
    producing crystallization screening solutions from stock solutions;
    purifying proteins; and
    setting up crystallization plates.

21. A method for mixing and delivering solutions, comprising:

controlling, from a processor system, a plurality of precision pumps, each pump drawing an associated solution from a solution source, and pumping the drawn solution out through an outlet;

controlling, from the processor system, a distributor which directs a solution from a particular pump outlet to a selected one of a plurality of solution holders wherein the particular pump outlet is not physically connected to the selected one of the plurality of solution holders.

22. The method of claim 21, further comprising: controlling, from the processor system, a multi-port distribution valve associated with each precision pump, each valve for connecting its associated pump to one of a plurality of associated inlets and outlets.

23. The method of claim 22, individual inlets of a particular pump being connected to different solutions, and each outlet of said pump being uniquely associated with one of said inlets, such that a particular solution always enters through one of said inlets and always exits through the associated outlet.

24. The method of claim 22, wherein each pump has an inlet connected to a water/wash source.

25. The method of claim 22, wherein each pump has an outlet for disposing of waste.

26. The method of claim 22, wherein each pump comprises a mixing chamber that receives components of a mixture.

27. The method of claim 26, wherein contents of the mixing chamber are pumped to a dispensing pin.

28. The method of claim 21, the distributor comprising a manifold for holding an array of dispensing pins, the pins connected to the pump outlet ports, wherein controlling the distributor comprises:

controlling, from the processor system, position of the manifold to align a particular pin and a particular receiving container.

29. The method of claim 28, wherein the dispensing pins are made of stainless steel.

30. The method of claim 28, wherein controlling position further comprises:

controlling, from the processor system, a gantry on which the manifold is supported.

31. The method of claim 30, wherein the processor system controls movement of the gantry in three dimensions.

32. The method of claim 28, wherein the manifold further holds an array of aspiration pins connected to the pump inlets, wherein controlling the position of the manifold further comprises:

positioning particular aspiration pins over particular solution holders; and inserting said aspiration pins into said solution holders for aspiration.

33. The method of claim 32, wherein a plurality of chromatography cartridges are connected between pump outlets and dispensing pins, further comprising, under control of the processor system:

aspirating a solution from a solution holder;

pumping of the aspirated solution over the chromatography cartridges;

washing of the cartridges with elution buffers; and collecting, in recipient containers, liquids flowing through the cartridges.

34. (Original) The method of claim 21, wherein a solution holder is one of a test tube, and a crystallization plate well.

35. The method of claim 21, wherein the precision pumps are precision syringe pumps.

36. The method of claim 21, wherein the processor system controls according to predefined recipes.

37. The method of claim 36, further comprising:

providing means for a user to view and edit a recipe.

38. The method of claim 21, the precision pumps being operated independently of each other.

39. The method of claim 21, wherein the processor system follows predetermined protocols to perform any of:

producing crystallization screening solutions from stock solutions;

purifying proteins; and setting up crystallization plates.

40. A system for mixing and delivering solutions, comprising:

means for controlling a plurality of precision pumps independently, each pump drawing an associated stock solution from a stock solution source, and pumping the drawn stock solution out through an outlet; and means for controlling a distributor which directs a stock solution from a particular pump outlet to a selected one of a plurality of solution holders, wherein said solution holder is not physically connected to the outlet of the particular pump.

41. A system for mixing and delivering solutions, comprising:

pump means for drawing plural stock solutions from plural stock solution sources, and for pumping drawn stock solutions out;

distributor means for directing the stock solutions into solution holders, wherein the solution holders are not physically connected to the pump means; and control means for controlling said pump means and said distributor means.

42. The system of claim 41, further comprising: multi-port valve means for directing flow into and out of said pump means, said control means controlling said multi-port valve means.

43. A system for mixing and delivering solutions, comprising:

a plurality of precision pumps, each pump drawing an associated stock solution from a solution source, and pumping the drawn solution out through an outlet, wherein a chromatography cartridge is connected to the pump outlet so that the drawn solution passes from the pump outlet through the chromatography cartridge;

a distributor which directs a solution from a particular precision pump to a selected one a plurality of solution holders; and a processor system which controls the precision pumps and the distributor.

* * * * *

UNITED STATES PATENT AND TRADEMARK OFFICE
CERTIFICATE OF CORRECTION

PATENT NO. : 6,818,060 B2
DATED : November 16, 2004
INVENTOR(S) : L.J. Stewart et al.

It is certified that error appears in the above-identified patent and that said Letters Patent is hereby corrected as shown below:

Title page,
Item [56], References Cited, OTHER PUBLICATIONS "CombiClover" reference, "www.e-meraldbiostructures.com" should read -- www.-emeraldbiostructures.com --
"Cavro XL Series Multi—Channel Pumps," reference, "Apr. 14," should read -- Apr. 18, --
Primary Examiner "Kumemeund" should read -- Kunemund --
Item [74], *Attorney, Agent or Firm*, "O'Connor;" should read -- O'Connor --
Item [57], ABSTRACT,
Line 11, "one the pump's" should read -- one of the pump's --

Column 1,
Line 51, "phenomena," should read -- phenomenon, --

Column 2,
Line 15, "are expected" should read -- is expected --
Line 49, "containers. a single" should read -- containers, a single --

Column 3,
Line 58, "is illustration" should read -- is an illustration --

Column 4,
Line 21, "or reservoirs" should read -- or that reservoirs --
Line 48, "for example" should read -- for example, --
Line 62, "example" should read -- example, --
Line 64, "for example" should read -- for example, --

Column 5,
Line 52, "software 30" should read -- software 30, --

Column 6,
Line 14, "+/-1" should read -- +/- 1 --
Line 43, "maybe" should read -- may be --

Column 8,
Line 2, "different size" should read -- different sized --
Line 27, "as for example," should read -- such as, for example, --

UNITED STATES PATENT AND TRADEMARK OFFICE
CERTIFICATE OF CORRECTION

PATENT NO. : 6,818,060 B2
DATED : November 16, 2004
INVENTOR(S) : L.J. Stewart et al.

It is certified that error appears in the above-identified patent and that said Letters Patent is hereby corrected as shown below:

Column 9,
Line 3, "pump 16" should read -- pump 14 --
Line 41, "twenty four" should read -- twenty-four --
Line 66, "comprising:" should read -- comprising --

Column 11,
Line 6, "outlet;" should read -- outlet; and --
Line 13, "comprising:" should read -- comprising --

Column 12,
Line 4, after "34." delete "(Original)"
Line 44, "comprising:" should read -- comprising --
Line 57, "one a plurality" should read -- one of a plurality --

Signed and Sealed this

Twenty-ninth Day of March, 2005

JON W. DUDAS
*Director of the United States Patent and Trademark Office*